(12) United States Patent
Kim

(10) Patent No.: US 6,496,223 B1
(45) Date of Patent: Dec. 17, 2002

(54) SOLID-STATE IMAGE SENSOR

(75) Inventor: Yong Gwan Kim, Chungcheongbuk-do (KR)

(73) Assignee: LG Semicon Co., Ltd., Chungcheongbuk-Do (KR)

(\*) Notice: Subject to any disclaimer, the term of this patent is extended or adjusted under 35 U.S.C. 154(b) by 0 days.

(21) Appl. No.: 08/953,511

(22) Filed: Oct. 17, 1997

(30) Foreign Application Priority Data

Jun. 19, 1997 (KR) .............................................. 97/25833

(51) Int. Cl.⁷ ................................................. H04N 5/335
(52) U.S. Cl. ...................................................... 348/311
(58) Field of Search ................................ 348/311, 317, 348/320, 322; 257/220, 221, 231, 232, 242

(56) References Cited

U.S. PATENT DOCUMENTS 5,323,034 A \* 6/1994 Furumiya .................. 257/232

FOREIGN PATENT DOCUMENTS

JP 08-186243 \* 7/1996 ........... H04N/5/335

\* cited by examiner

*Primary Examiner*—Aung S. Moe
(74) *Attorney, Agent, or Firm*—Morgan, Lewis & Bockius LLP

(57) ABSTRACT

A solid-state image sensor in which an interface area between a vertical charge coupled device (VCCD) and a horizontal charge coupled device (HCCD) is formed under the HCCD, thereby maximizing charge-transferring efficiency is disclosed, including a substrate; a well formed in the substrate; a first impurity region formed in the well under the VCCD and the HCCD; and second impurity regions selectively formed in the first impurity region to have a border from the first impurity region under the HCCD, wherein the second impurity regions have a different ion concentration from the first impurity region.

14 Claims, 8 Drawing Sheets

SOLID-STATE IMAGE SENSOR

BACKGROUND OF THE INVENTION

1. Field of the Invention

The present invention relates to a solid-state image sensor and, more particularly, to a solid-state image sensor in which an interface area between a vertical charge coupled device (VCCD) and a horizontal charge coupled device (HCCD) is formed under the HCCD, thereby maximizing charge-transferring efficiency.

2. Discussion of the Related Art

FIG. 1 is a layout of a general solid-state image sensor, which includes photodiode regions for converting light signals into electric signals, a VCCD formed at right angle to the photodiode regions for transferring the converted signal charges, an HCCD formed at right angle to the VCCD for transferring the signal charges transferred from the VCCD, and a sensing amplifier SA for sensing and amplifying the signal charges transferred from the HCCD.

A VCCD-HCCD (V-H) interface area is placed between a VCCD and an HCCD. FIG. 2 is a layout of conventional V-H interface areas and FIG. 3 shows potential levels of V-H interface areas.

As shown in FIG. 2, signal charges, generated by photoelectric conversion in a photodiode region (PD), are transferred toward an HCCD by means of a VCCD. The transferred signal charges are then transferred to a sensing amplifier SA by clock signals Hφ1, Hφ2 applied to polygates of the HCCD. At this time, the HCCD and the VCCD have different clock levels, as shown in FIG. 3.

The VCCD generally carries out negative clocking. Since the VCCD is heightened to be in an accumulation mode during blanking of the HCCD, noise is made. Thus, potential barrier of a channel stop layer is not lowered.

As described above, signal charges are transferred from a VCCD to an HCCD because of difference of their clock levels.

In such a conventional solid-state image sensor, it was fine that VCCDs and HCCD are formed using one mask. However, since it is tendency to reduce a size of a device, any improvement of performance of a solid-state image sensor can hardly be expected.

FIG. 4 is a solid-state image sensor in which a VCCD and an HCCD are formed using one mask. Only one mask on a substrate 11 is used to form a p-well 13 over which a VCCD and an HCCD will be formed. A buried charge coupled device (BCCD) 15 and a channel stop (CST) layer 17 are formed in the p-well 13. In case a VCCD and an HCCD are formed at a time using one mask, a size of the semiconductor device can be a problem. That is, when the size of the semiconductor device is diminished, and its packing density is heightened, a size of a pixel defining photodiodes and VCCDs is diminished as well. Accordingly, a VCCD becomes much smaller than an HCCD. For this problem, each of a VCCD and an HCCD is formed using its own mask to improve the performance of a semiconductor device.

FIG. 5 is a cross-sectional view taken along line I–I' of FIG. 2. As shown in FIG. 5, each of p-wells for a VCCD and an HCCD is formed using a mask. To obtain such a solid-state image sensor, a first p-well 13 for a VCCD is formed in a semiconductor substrate 11 using a mask. Subsequently, a second p-well 13a for an HCCD is formed using another mask. Next, ion-implanting process is performed over the first and second p-wells 13 and 13a, thus forming a BCCD 15 and a channel stop layer 17 therein.

However, since p-wells for VCCD and HCCD are formed using different masks, Hence, impurity ions having different concentrations for a VCCD and an HCCD are implanted in a diminished the size of a semiconductor device, thereby enhancing its packing density.

However, a conventional solid-state image sensor has the following problems. Since each of a VCCD and an HCCD is formed using a mask, V-H interface area is a problem. In other words, a p-well for a VCCD partially overlaps another p-well for an HCCD and thus a relatively big potential pocket is formed in the overlapped area than the other areas. Hence, on transferring signal charges, discontinuity is generated as though a well is formed in a transfer channel. Such discontinuity generates fixed pattern noise such as vertical black lines, thereby causing degradation of picture quality.

SUMMERY OF THE INVENTION

Therefore, the present invention is directed to a solid-state image sensor that substantially obviates one or more of problems due to limitations and disadvantages of the related art.

An object of the invention is to provide a solid-state image sensor in which a V-H interface area is formed in a VCCD to remove fixed pattern noise such as vertical black lines, thus enhancing its performance.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a solid-state image sensor having a VCCD and an HCCD includes a substrate, a well formed in the substrate, a first impurity region formed in the well under the VCCD and HCCD, and a second impurity region selectively formed in the first impurity to have a border from the first impurity region under the HCCD and having a different ion concentration from the first impurity region.

It is to be understood that both the foregoing general description and the following detailed description are exemplary and explanatory and are intended to provide further explanation of the invention as claimed.

BRIEF DESCRIPTION OF THE DRAWINGS

These and various other objects, features, and advantages of the present invention will be readily understood with reference to the following detailed description read in conjunction with the accompanying drawings, in which.

DETAILED DESCRIPTION OF THE PREFERRED EMBODIMENTS

Reference will now be made in detail to the preferred embodiments of the present invention, examples of which are illustrated in the accompanying drawings.

Figure 1:
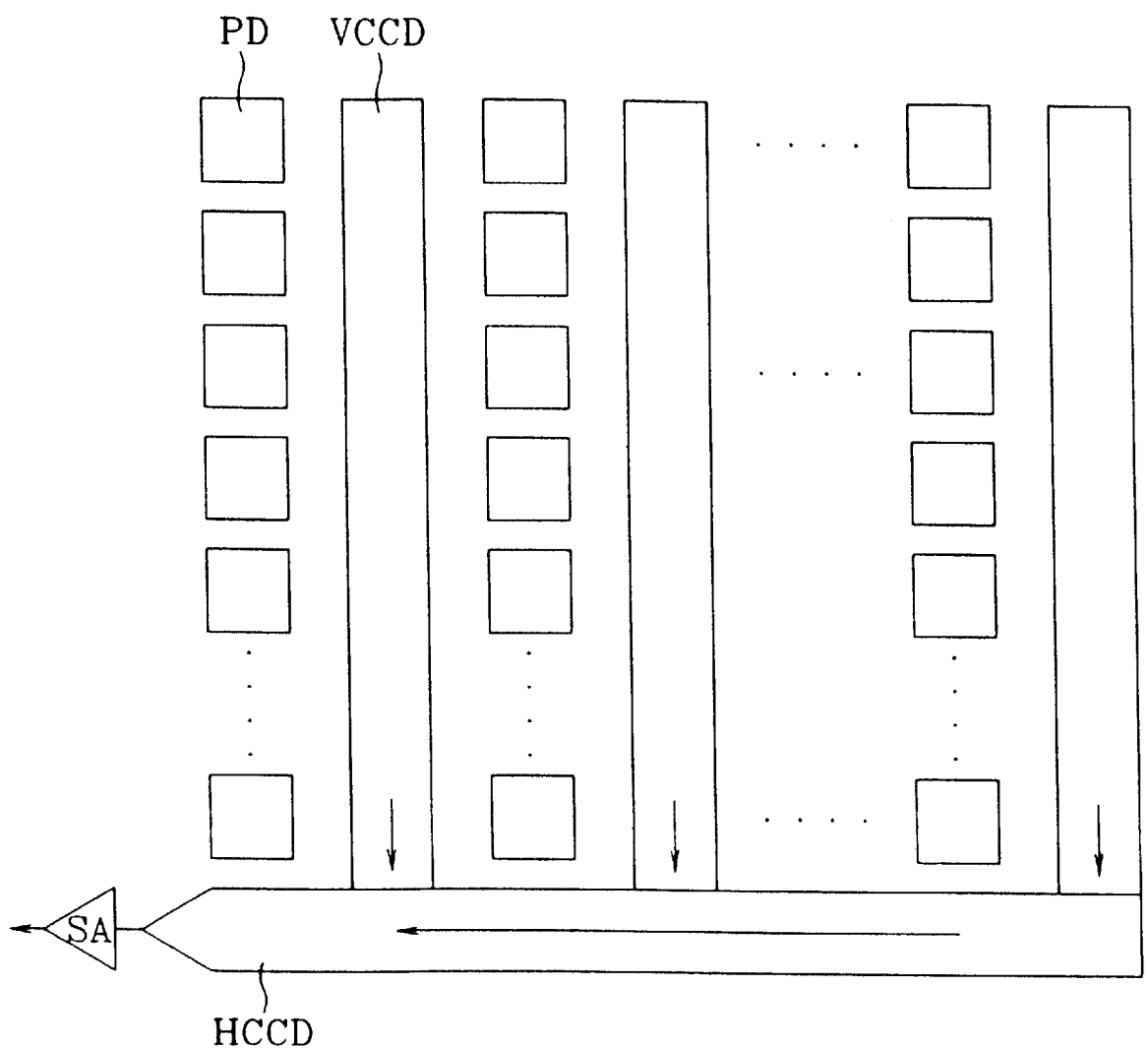
FIG. 1 is a layout of a general solid-state image sensor.
Figure 2:
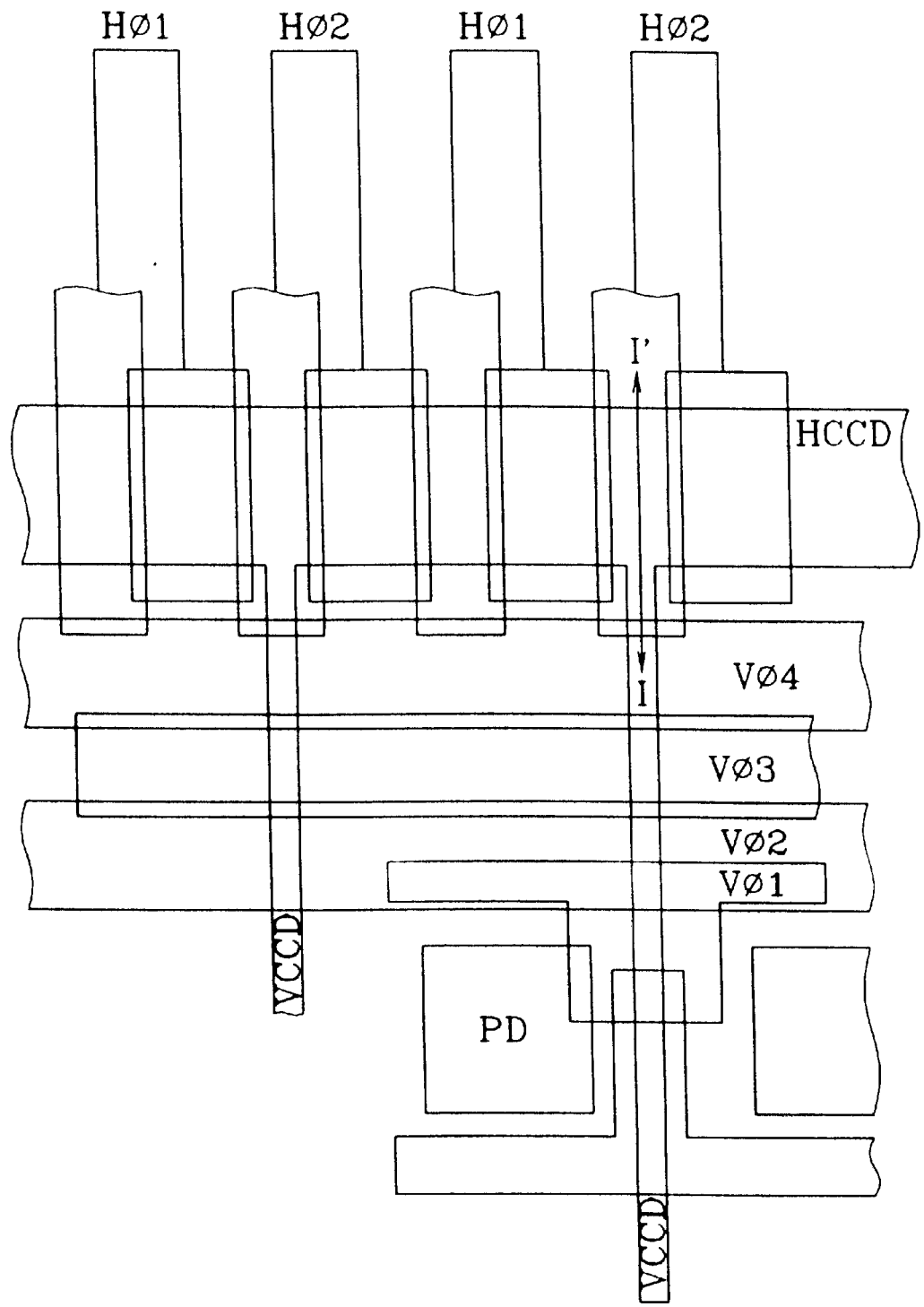
FIG. 2 is a layout of V-H interface area in a conventional solid-state image sensor.
Figure 3:
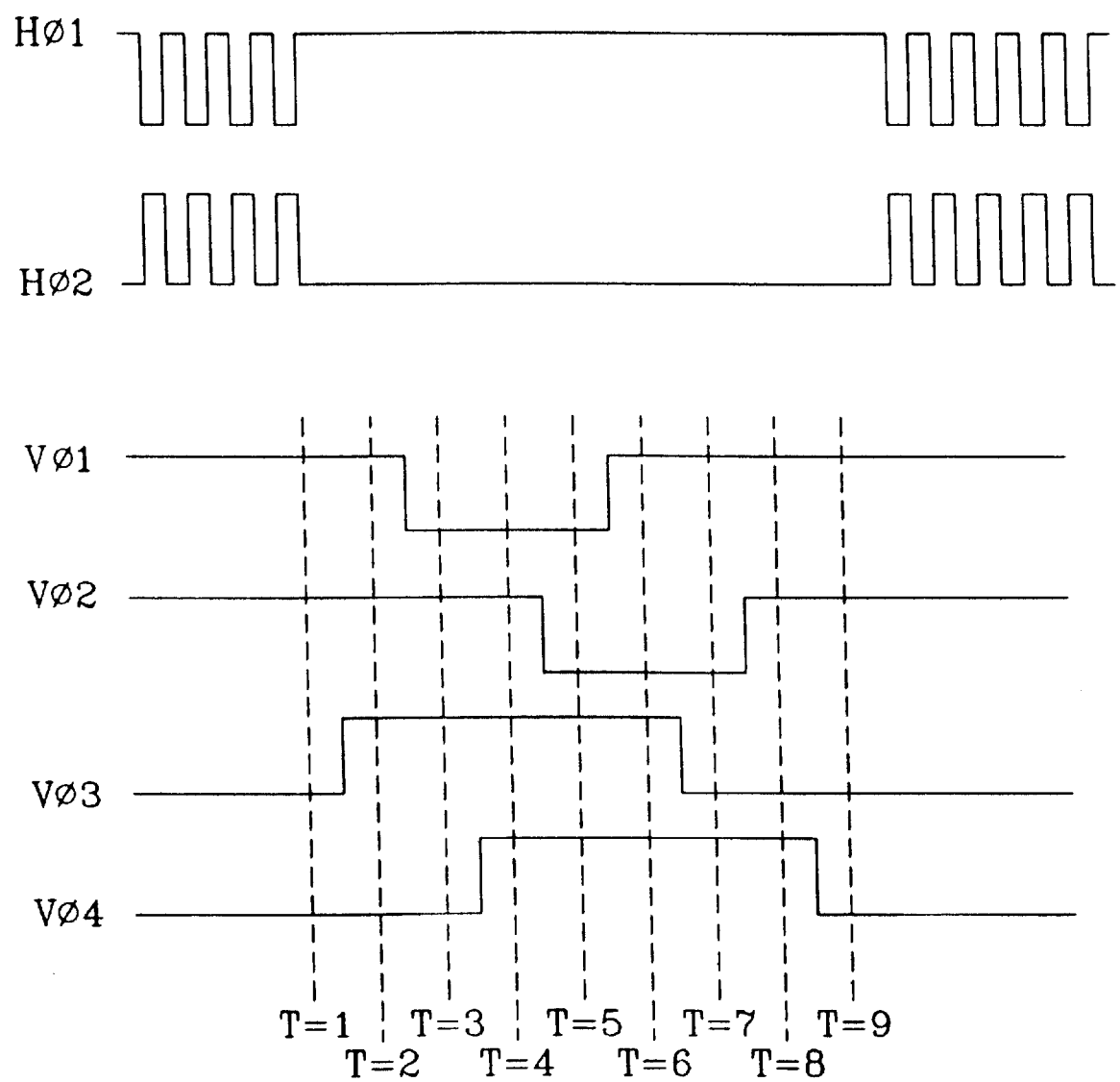
FIG. 3 shows potential levels of V-H interface area in a conventional solid-state image sensor.
Figure 4:
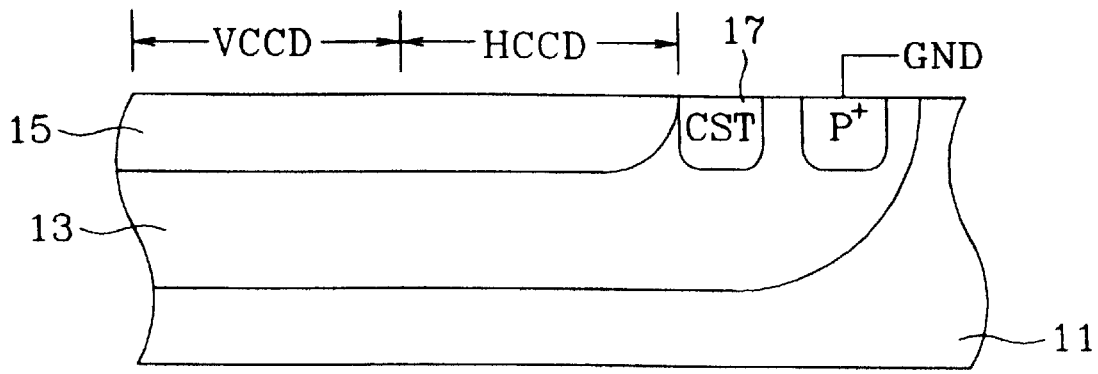
FIG. 4 is a cross-sectional view of the conventional solid-state image sensor, taken along line I–I' of FIG. 2 in accordance with a first embodiment.
Figure 5:
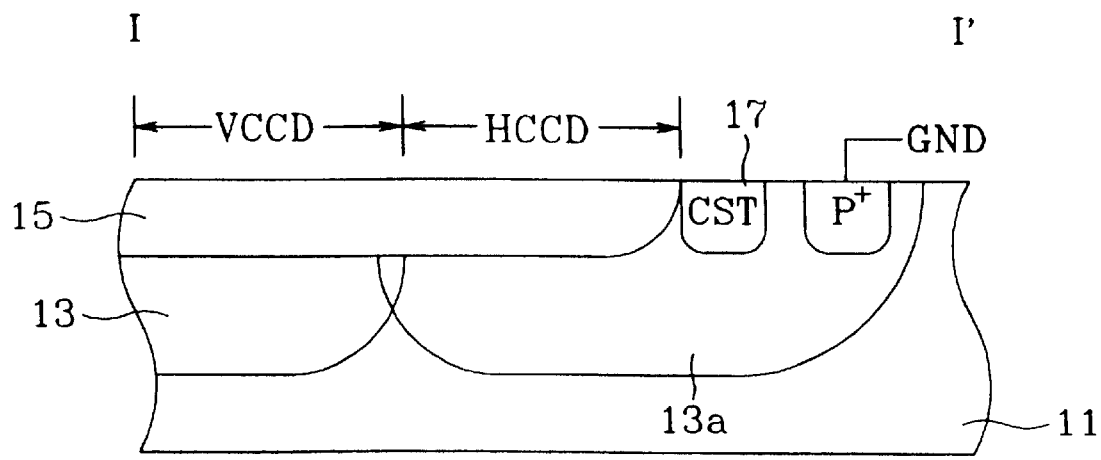
FIG. 5 is a cross-sectional view of the solid-state image sensor, taken along line I–I' of FIG. 2, in accordance with a second embodiment.
Figure 6A:
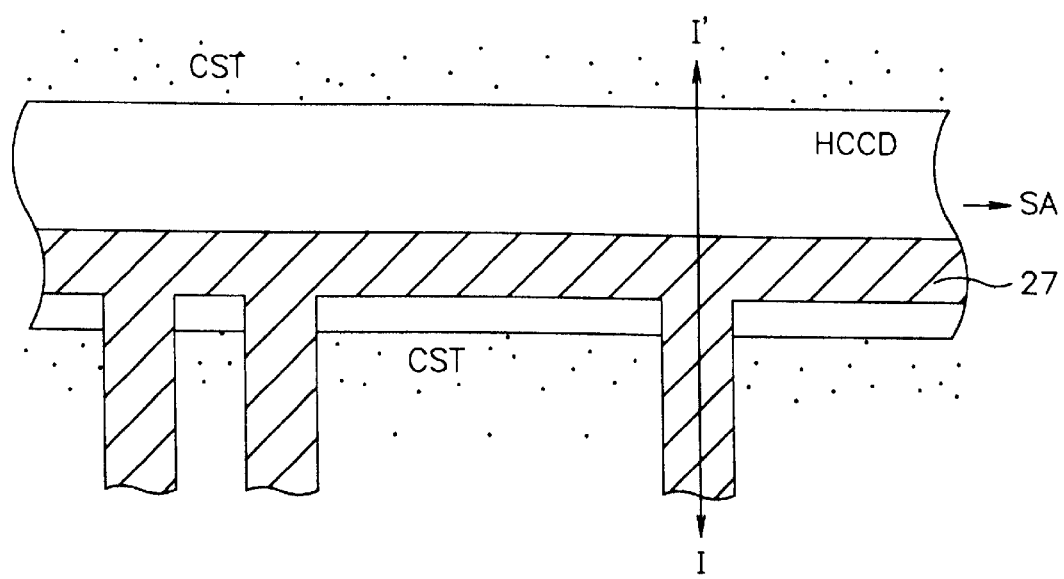
FIG. 6A is a layout of a solid-state image sensor in accordance with a first embodiment of the present invention.
Figure 6B:
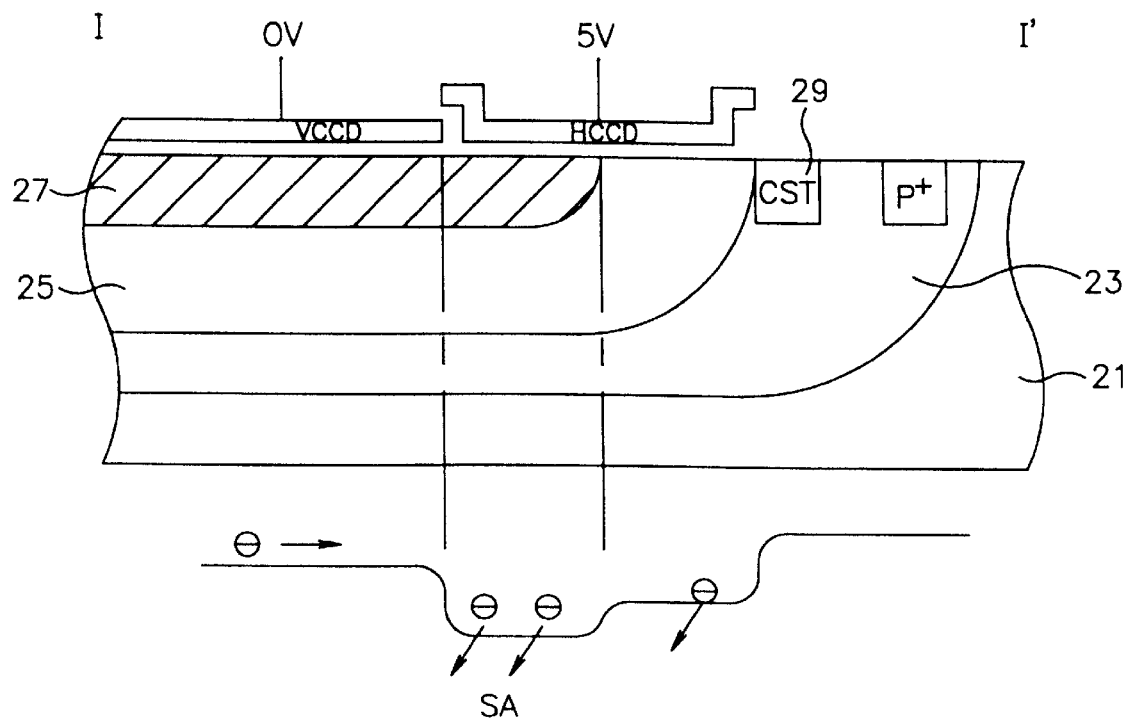
FIG. 6B is a cross-sectional view, taken along line I–I' of FIG. 6A, showing a structure of the solid-state image sensor in accordance with the first embodiment of the present invention.

FIG. 6A is a layout of a solid-state image sensor in accordance with the first embodiment of the present invention, and FIG. 6B is a cross-sectional view taken along line I–I' of FIG. 6A. As shown in FIGS. 6A and 6B, only one mask is used to form a p-well 23 for an HCCD and a VCCD and then a first impurity region 25 is formed in the p-well 23. At this time, the first impurity region 25 is a first BCCD. Next, in the first impurity region 25, there is formed a second impurity region 27, which is a second BCCD. At this time, the second impurity region extends to a predetermined area of the first impurity region under the HCCD.

Referring to FIG. 6B, the aforementioned solid-state image sensor having a VCCD and an HCCD includes an n conductive type semiconductor substrate 21, a p-well 23 formed in the semiconductor substrate 21, a first impurity region 25 formed in the p-well 23 under the HCCD and the VCCD, and a second impurity region 27 formed in the first impurity region under the VCCD and extending to a predetermined area of the first impurity region under the HCCD. A channel stop impurity region 29 is formed in the p-well 23 under the HCCD. The first and second impurity regions 25 and 27 are first and second BCCDs, respectively.

In the solid-state image sensor of the first embodiment, the overlapping area of the first and second impurity regions 25 and 27 has a different concentration of the impurity ions from that of the first impurity region 25. Thus, owing to the concentration difference, discontinuity is generated at the boundary between the overlapping area and the first impurity region 25. Such a discontinuity is a factor hindering the transfer of signal charges. However, since the discontinuity is generated in the HCCD, it doesn't cause any problems in the transfer of signal charges. That is to say, since the potential well is formed in the same direction as charges are transferred, there is caused no problem in transferring signal charges along the potential well to a sensing amplifier SA.

Besides, since impurity regions have different concentrations of impurity ions under the VCCD and the HCCD, there is no problem in miniaturizing devices.

Figure 7A:
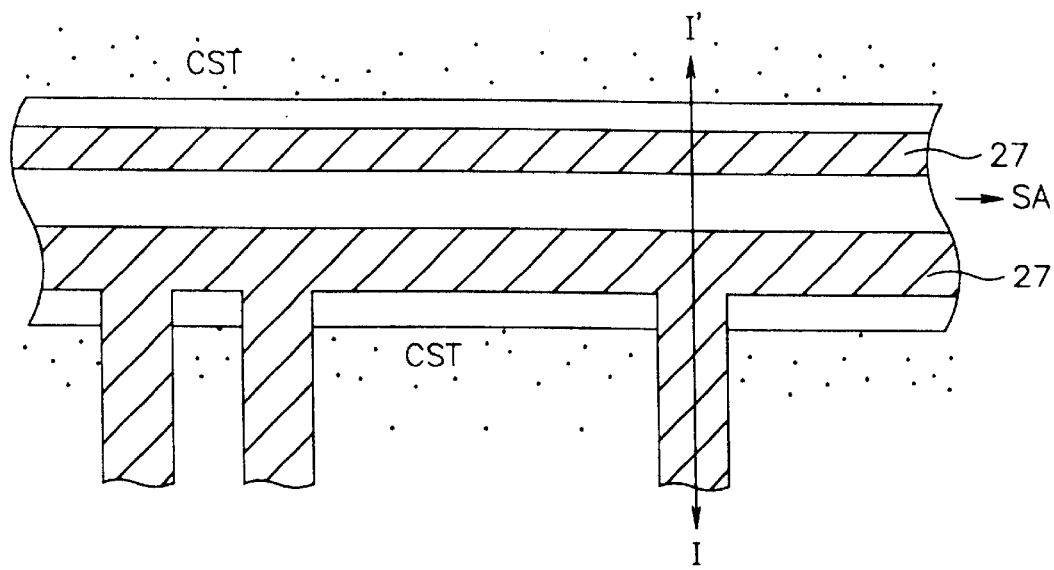
FIG. 7A is a layout of a solid-state image sensor in accordance with a second embodiment of the present invention.
Figure 7B:
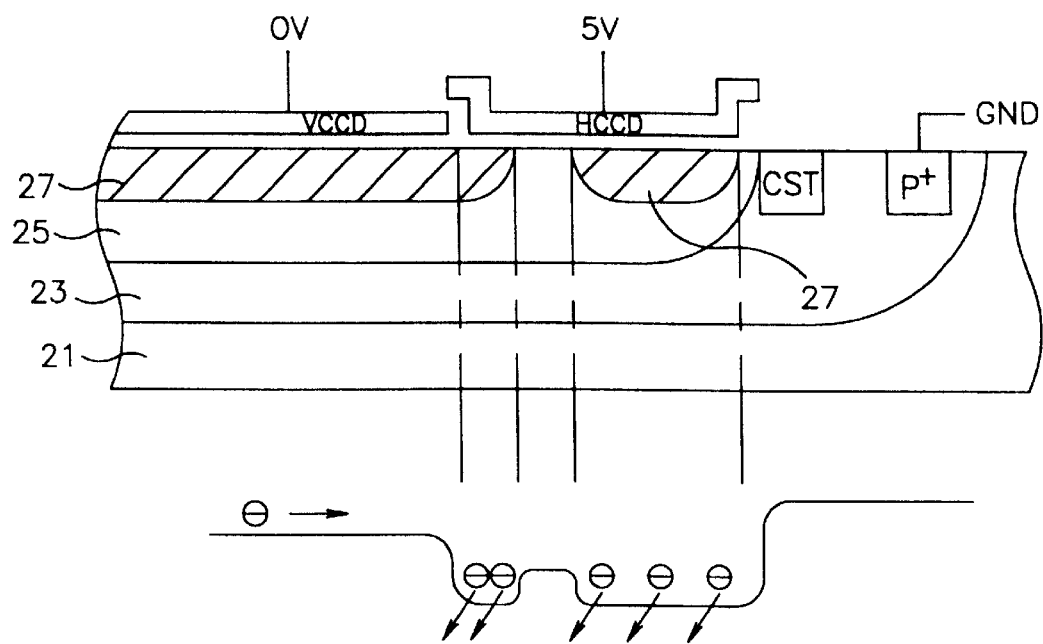
FIG. 7B is a cross-sectional view, taken along line I–I' of FIG. 7A, showing a structure of the solid-state image sensor in accordance with the second embodiment of the present invention.

FIG. 7A is a layout of a solid-state image sensor in accordance with the second embodiment of the present invention and FIG. 7B is a cross-sectional view taken along line I–I' of FIG. 7A.

As shown in FIGS. 7A and 7B, discontinuity generated by concentration difference of impurity ions is caused in an HCCD in the solid-state image sensor of the second embodiment, like that of the first embodiment. That is to say, as shown in FIG. 7B, the solid-state image sensor having a VCCD and an HCCD includes an n conductive type semiconductor substrate 21, a p-well 23 in the semiconductor substrate 21, a first impurity region 25 formed in the p-well 23 under the VCCD and HCCD, and a second impurity region 27 formed in the first impurity region 25 under the HCCD, wherein the second impurity region 27 under the HCCD is spaced apart from the VCCD by a predetermined distance.

According to the second embodiment of the present invention, potential well becomes big where the second impurity region 27 under the HCCD is formed. At this time, the first and second impurity regions 25 and 27 are first and second BCCDs, respectively.

However, since the potential well is formed in the same direction as signal charges are transferred, there is no problem in transferring signal charges to a sensing amplifier SA.

Besides, since impurity regions have different concentrations of impurity ions under the VCCD and the HCCD, the solid-state image sensor of the present invention advantageously applies to miniaturized semiconductor devices and enough margins can be provided in design.

Figure 8:
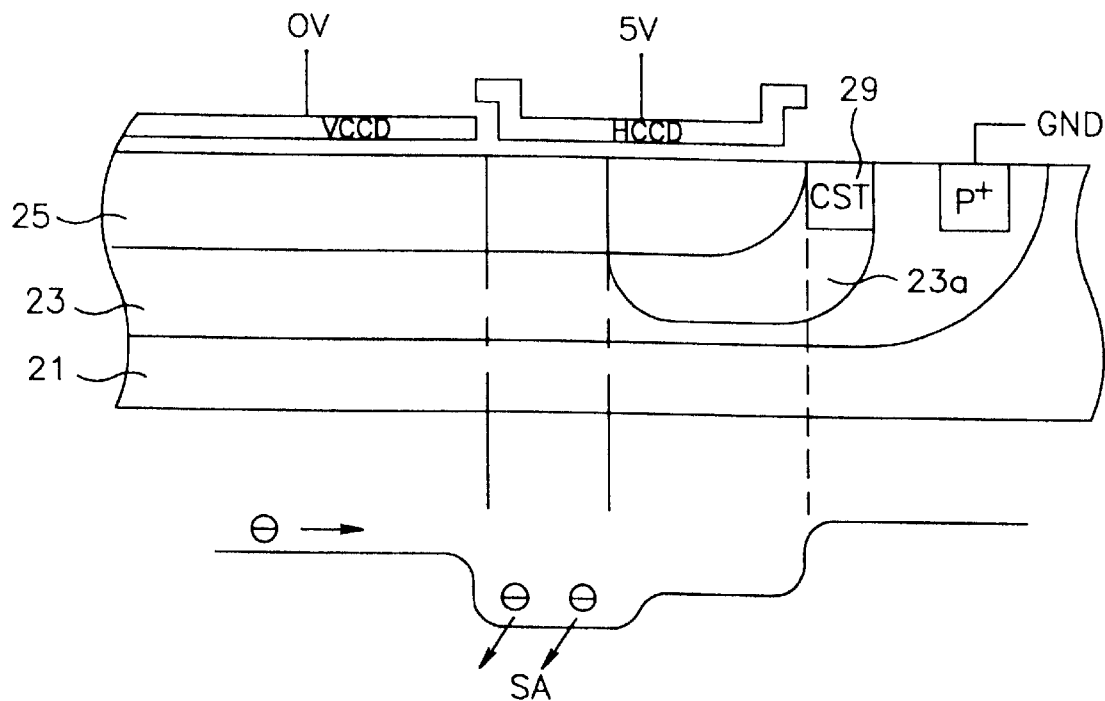
FIG. 8 is a cross-sectional view of a solid-state image sensor in accordance with a third embodiment of the present invention.

FIG. 8 is a cross-sectional view showing a structure of a solid-state image sensor in accordance with the third embodiment of the present invention. As shown in FIG. 8, a solid-state image sensor having a VCCD and an HCCD includes an n conductive type semiconductor substrate 21, a first p-well 23 formed in the semiconductor substrate 21, an impurity region formed in the first p-well 23 under the HCCD and the VCCD, and a second p-well 23a formed in the first p-well 25 under the HCCD, wherein the second p-well 23a is spaced apart from the VCCD by a predetermined distance. At this time, the impurity region 25 is a BCCD. In addition, a channel stop impurity region 29 is formed in the second p-well 23a at one side of the HCCD.

In accordance with the third embodiment of the present invention, like the first and second embodiments, the second p-well 23a is formed inside the first p-well 23 under the HCCD so that discontinuity area is formed under the HCCD.

As shown in FIG. 8, a potential barrier is formed under the second p-well 23a. Since the potential barrier is formed under the HCCD, there is caused no problem in transferring signal charges.

Figure 9:
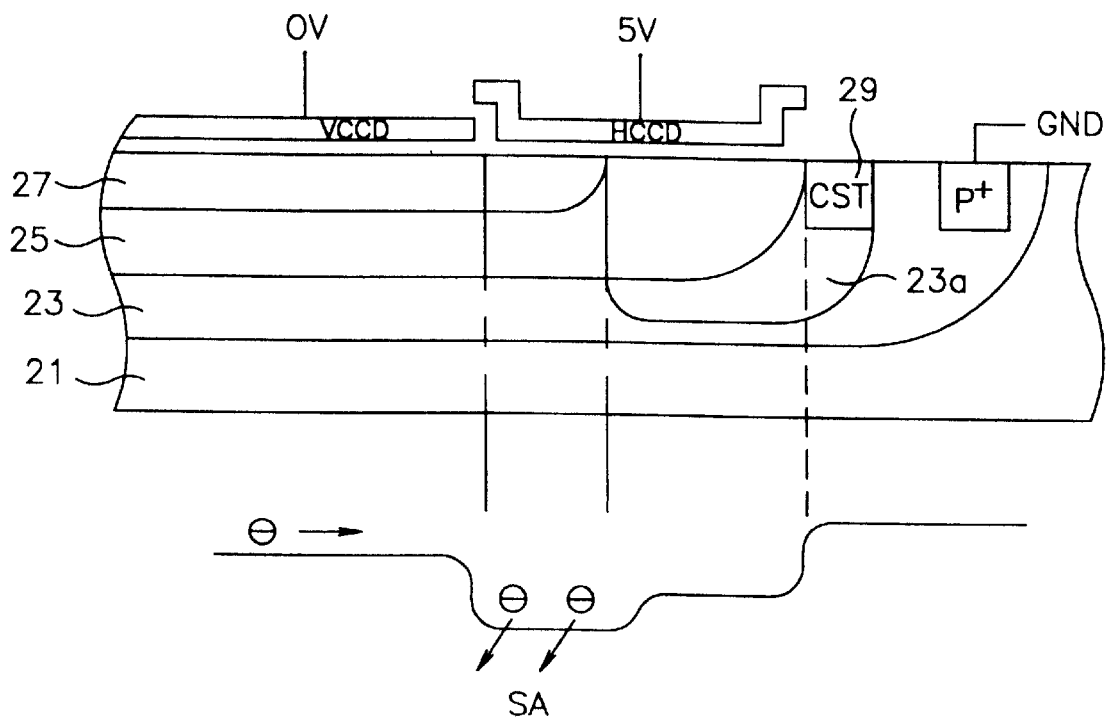
FIG. 9 is a cross-sectional view of a solid-state image sensor in accordance with a fourth embodiment of the present invention.

FIG. 9 is a cross-sectional view showing a structure of a solid-state image sensor in accordance with the fourth embodiment of the present invention, where two discontinuities are generated under an HCCD. As shown in FIG. 9, a solid-state image sensor having a VCCD and an HCCD includes an n conductive type semiconductor substrate 21, a first p-well 23 formed in the semiconductor substrate 21, a second p-well 23a formed in the first p-well 23 under the HCCD, a first impurity region 25 formed in the first p-well 23 inclusive of the second p-well 23a, and a second impurity region 27 formed in the first impurity region 25 under the VCCD and extending to a predetermined area of the first impurity region under the HCCD. A channel stop impurity region 29 is formed in the second p-well 23a at one side of the HCCD.

In the same way as the first, second, and third embodiments, since discontinuity is generated under the HCCD because of difference concentrations of impurity ions, it doesn't affect the transferring of signal charges.

Figure 10:
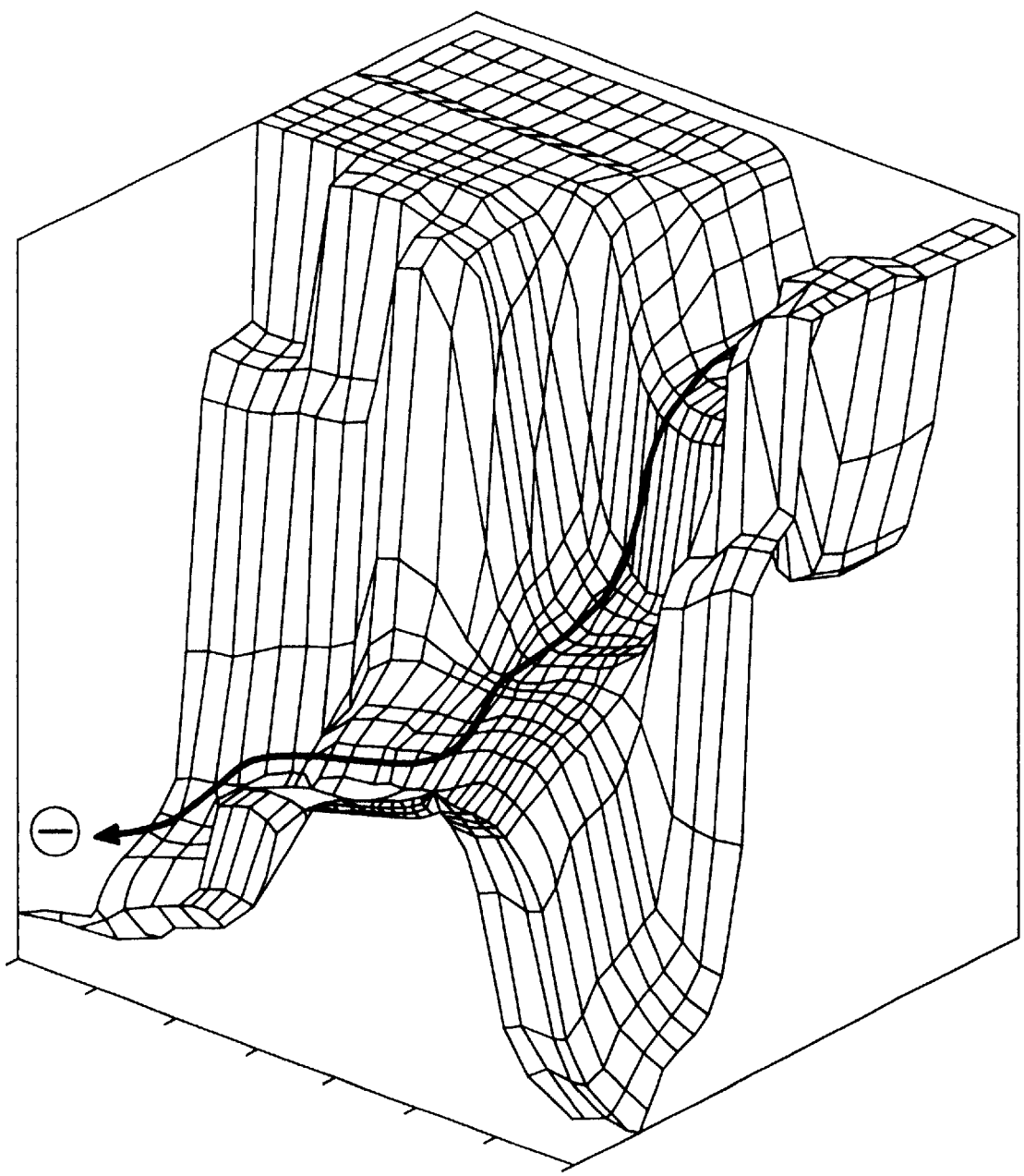
FIG. 10 shows a potential profile of a solid-state image sensor in accordance with the present invention.

FIG. 10 shows a potential profile in a three-dimension. As shown in FIG. 10, as described in the first, second, third, and fourth embodiments, impurity regions have different concentrations of impurity ions under a VCCD and an HCCD, and discontinuity generated due to concentration difference of impurity ions is formed under the HCCD, there is caused no problem in transferring signal charges into a sensing amplifier.

Such a solid-state image sensor of the present invention has the following advantages. First, since impurity regions have different concentrations of impurity ions under a VCCD and an HCCD, suitable tunings can be provided. Second, there is removed a fixed pattern noise which may be generated in a V-H interface area between a VCCD and an HCCD, thereby improving picture quality. Finally, charge-transferring efficiency is maximized.

It will be apparent to those skilled in the art that various modification and variations can be made in the solid-state image sensor of the present invention without departing from the spirit or scope of the inventions. Thus, it is intended that the present invention cover the modifications and variations of this invention provided they come within the scope of the appended claims and their equivalents.

What is claimed is:

1. A solid-state image sensor having a VCCD and an HCCD, comprising:

a substrate;

a well formed in the substrate;

a first impurity region formed in the well under the VCCD and the HCCD; and second impurity regions selectively formed in the first impurity region to have a border from the first impurity region under the HCCD, wherein the second impurity regions have a different ion concentration from the first impurity region.

2. The solid-state image sensor as claimed in claim 1, wherein the second impurity regions are formed in the first impurity region under the VCCD, extending to a predetermined area of the first impurity region under the HCCD, or one of the second impurity regions is formed in the first impurity region under the HCCD and spaced apart from the VCCD by a predetermined distance.

3. The solid-state image sensor as claimed in claim 1, wherein the first and second impurity regions are BCCDs of n conductive type.

4. The solid-state image sensor as claimed in claim 1, further comprising:

a channel stop impurity region in the well at one side of the HCCD.

5. A solid-state image sensor having a VCCD and an HCCD, comprising:

a substrate;

a well formed in the substrate;

a first impurity region formed in the well under the VCCD and the HCCD; and a second impurity region formed in the first impurity region under the VCCD, wherein the second impurity region extends to a predetermined area of the first impurity region under the HCCD, wherein the well is of p conductive type and the first and second impurity regions are BCCDs of n conductive type.

6. The solid-state image sensor as claimed in claim 5, wherein a size of a potential well becomes big under the second impurity region extended under the HCCD.

7. The solid-state image sensor as claimed in 5, further comprising:

a channel stop impurity region in the well at one side of the HCCD.

8. A solid-state image sensor having a VCCD and an HCCD, comprising:

a substrate;

a well formed in the substrate;

a first impurity region formed in the well under the HCCD and the VCCD; and a second impurity region formed in the first impurity region under the HCCD, wherein the second impurity region under the HCCD is spaced apart from the VCCD by a predetermined distance, wherein the well is of p conductive type and the substrate and the first and second impurity regions are BCCDs of n conductive type.

9. The solid-state image sensor as claimed in claim 8, wherein a size of a potential well becomes big under the second impurity region under the HCCD.

10. The solid-state image sensor as claimed in claim 8, further comprising:

a channel stop impurity region in the well at one side of the HCCD.

11. A solid-state image sensor having a VCCD and an HCCD, comprising:

a substrate;

a first well formed in the substrate;

a second well formed in a predetermined area of the first well, wherein the predetermined area is at least partially under the HCCD;

a first impurity region formed in the first and second wells under the HCCD and the VCCD; and a second impurity region formed in the first impurity region under VCCD, wherein the second impurity region extends to a predetermined area of the first impurity region under the HCCD.

12. The solid-state image sensor as claimed in claim 11, wherein the substrate and the first and second impurity regions are of n conductive type, and the first and second wells are of p conductive type.

13. The solid-state image sensor as claimed in claim 11, wherein a size of a potential well becomes big at the extended area under the HCCD and potential barrier becomes big under the second well.

14. The solid-state image sensor as claimed in claim 11, further comprising:

a channel stop impurity region in the second well at one side of the HCCD.

* * * * *